US012800660B2

(12) United States Patent
Lee et al.

(10) Patent No.: US 12,800,660 B2
(45) Date of Patent: Nov. 17, 2026

(54) APPARATUS AND METHOD FOR DETECTING DEFECT IN SECONDARY BATTERY

(71) Applicant: LG ENERGY SOLUTION, LTD., Seoul (KR)

(72) Inventors: Yonggyun Lee, Daejeon (KR); Jong Seong You, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 375 days.

(21) Appl. No.: 18/278,595

(22) PCT Filed: Jan. 11, 2023

(86) PCT No.: PCT/KR2023/000501
§ 371 (c)(1),
(2) Date: Aug. 23, 2023

(87) PCT Pub. No.: WO2023/210924
PCT Pub. Date: Nov. 2, 2023

(65) Prior Publication Data
US 2025/0044356 A1 Feb. 6, 2025

(30) Foreign Application Priority Data
Apr. 27, 2022 (KR) ........................ 10-2022-0052003

(51) Int. Cl.
*G01R 31/36* (2020.01)
*G01R 31/378* (2019.01)
(Continued)

(52) U.S. Cl.
CPC ....... *G01R 31/3644* (2013.01); *G01R 31/378* (2019.01); *G01R 31/3865* (2019.01);
(Continued)

(58) Field of Classification Search
CPC ............. G01R 31/3644; G01R 31/389; G01R 31/392; G01R 31/3865; G01R 31/378; H01M 10/4285
(Continued)

(56) References Cited

U.S. PATENT DOCUMENTS 8,471,566 B2 6/2013 Nishino et al.
11,769,933 B2 * 9/2023 Mizawa .............. H01M 50/528 429/94
(Continued)

FOREIGN PATENT DOCUMENTS

CN 102680485 A 9/2012
CN 111357145 A 6/2020
(Continued)

OTHER PUBLICATIONS

International Search Report and Written Opinion dated May 8, 2023, issued in corresponding International Patent Application No. PCT/KR2023/000501.
(Continued)

*Primary Examiner* — Huy Q Phan
*Assistant Examiner* — Trung Q Nguyen
(74) *Attorney, Agent, or Firm* — Morgan, Lewis & Bockius LLP

(57) ABSTRACT

An apparatus detects a defect in a secondary battery. The secondary battery includes a jelly-roll having first and second electrode tabs, and an electrode non-coated portion wound around an outermost periphery thereof. The apparatus includes a first contact unit configured to contact any one of the first electrode tab and the second electrode tab; a second contact unit configured to contact at least a part of the electrode non-coated portion and come into contact with the jelly-roll by moving in a direction of a center of the jelly-roll; and an inspection unit configured to detect
(Continued)

whether the jelly-roll is defective by measuring one or more of current, voltage, and resistance of the jelly-roll by an electric contact with the first and second electrode tabs.

21 Claims, 3 Drawing Sheets

(51) Int. Cl.
*G01R 31/385* (2019.01)
*G01R 31/389* (2019.01)
*G01R 31/392* (2019.01)
*H01M 10/42* (2006.01)

(52) U.S. Cl.
CPC ......... *G01R 31/389* (2019.01); *G01R 31/392* (2019.01); *H01M 10/4285* (2013.01)

(58) Field of Classification Search
USPC ...................... 324/500, 600, 76.11, 415–433
See application file for complete search history.

(56) References Cited

U.S. PATENT DOCUMENTS

| | | | | |
|---|---|---|---|---|
| 2006/0024574 | A1* | 2/2006 | Yim | H01M 50/375 429/174 |
| 2009/0305118 | A1* | 12/2009 | Kim | H01M 50/103 429/93 |
| 2010/0285342 | A1* | 11/2010 | Lee | H01M 50/595 429/94 |
| 2012/0121968 | A1* | 5/2012 | Nakagawa | H01M 50/533 429/163 |
| 2013/0334052 | A1* | 12/2013 | Chua | C25D 21/06 204/252 |
| 2017/0207439 | A1* | 7/2017 | Park | H01M 50/3425 |
| 2020/0280108 | A1* | 9/2020 | Tomar | H01M 10/482 |
| 2020/0400747 | A1 | 12/2020 | Min et al. | |
| 2020/0411915 | A1* | 12/2020 | Kluge | G01R 31/396 |
| 2022/0357287 | A1* | 11/2022 | Lee | H01M 10/42 |
| 2023/0038456 | A1 | 2/2023 | Lee et al. | |
| 2023/0160975 | A1* | 5/2023 | Yoo | G01R 19/25 324/555 |

FOREIGN PATENT DOCUMENTS

| | | | |
|---|---|---|---|
| CN | 214313297 | U | 9/2021 |
| CN | 216117702 | U | 3/2022 |
| JP | 2000-235871 | A | 8/2000 |
| JP | 3183139 | B2 | 7/2001 |
| JP | 2009-043418 | A | 2/2009 |
| JP | 4992599 | B2 | 8/2012 |
| JP | 4993196 | B2 | 8/2012 |
| JP | 5060623 | B2 | 10/2012 |
| JP | 2016-001195 | A | 1/2016 |
| KR | 1998-0022709 | A | 7/1998 |
| KR | 10-0177213 | B1 | 5/1999 |
| KR | 10-2010-0071758 | A | 6/2010 |
| KR | 10-2014-0085961 | A | 7/2014 |
| KR | 10-2018-0025542 | A | 3/2018 |
| KR | 10-2022-0051673 | A | 4/2022 |

OTHER PUBLICATIONS

The extended European Search Report (EESR) dated 23762128.9, issued in corresponding EP Patent Application No. Feb. 5, 2025. (Note: JP 2009-043418 A was previously cited).
Office Action dated Jul. 2, 2026 issued in the corresponding Chinese Patent Application No. 202380010566.X with the English translation. (Note: JP 2016-001195 A, KR 1998-0022709 A, CN 216117702 U, and JP 2009-043418 A already submitted.).

* cited by examiner

[FIG. 1]
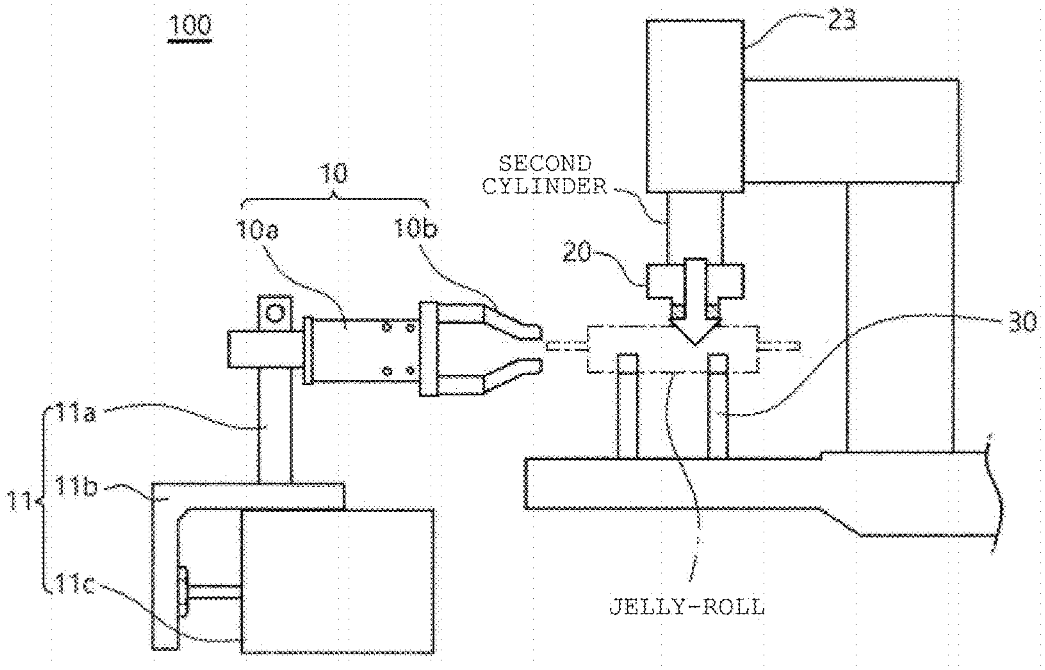

[FIG. 2]
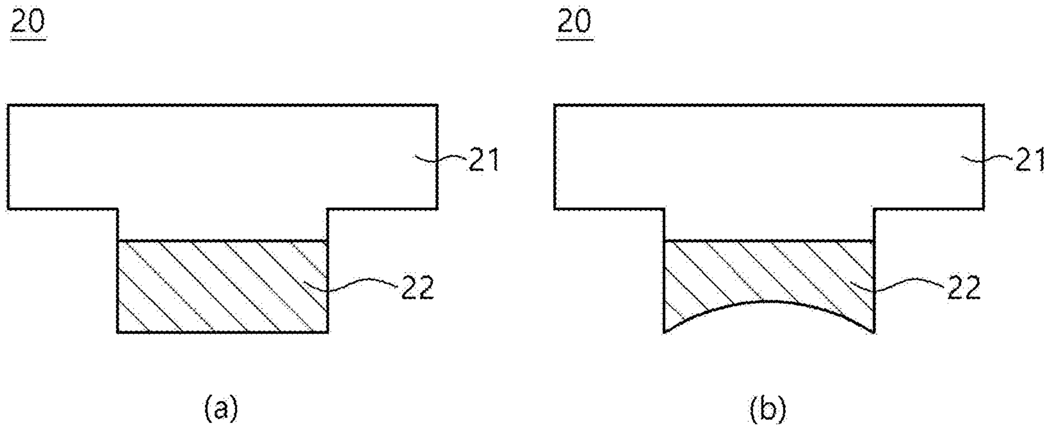

[FIG. 3]
30
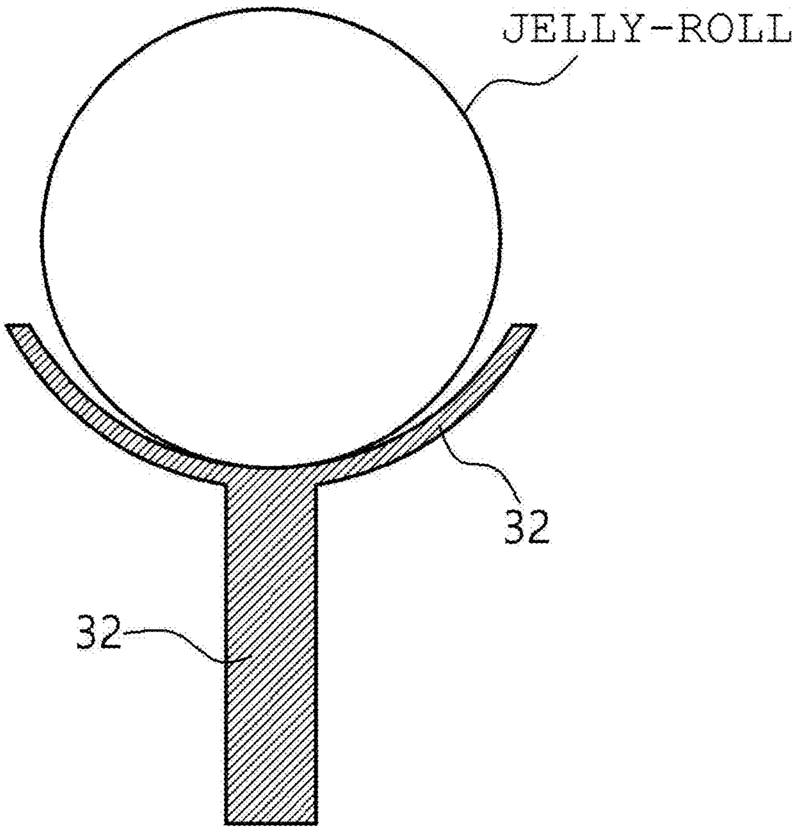

APPARATUS AND METHOD FOR DETECTING DEFECT IN SECONDARY BATTERY

TECHNICAL FIELD

This application claims priority to and the benefit of Korean Patent Application No. 10-2022-0052003 filed with the Korean Intellectual Property Office on Apr. 27, 2022, the entire contents of which are incorporated herein by reference.

The present invention relates to an apparatus and method for detecting a defect in a secondary battery. Specifically, the present invention relates to an apparatus and method for detecting a defect in a secondary battery, which apply voltage to a jelly-roll and identify whether a jelly-roll internal short circuit occurs.

BACKGROUND ART

Unlike primary batteries, secondary batteries may be rechargeable and have small scales and high capacities. Recently, research and development have been actively conducted on the secondary batteries. As development of technologies and demands for mobile devices are increased, there is a rapidly increasing demand for rechargeable batteries as energy sources.

The secondary batteries are classified into coin-type batteries, cylindrical batteries, angular batteries, and pouch-type batteries depending on shapes of pouches. In the secondary battery, an electrode assembly mounted in the pouch is a power generation element that has a structure made by stacking electrodes and separators and may be charged and discharged.

The electrode assemblies may be approximately classified into a Jelly-roll-type electrode assembly made by interposing a separator between sheet-shaped positive and negative electrodes coated with active materials and winding the stack, a stack-type electrode assembly made by sequentially stacking a plurality of positive and negative electrodes in a state in which separators are interposed between the plurality of positive and negative electrodes, and a stack/folding-type electrode assembly made by winding stack-type unit cells by using long separation films.

In the electrode assembly, the separator serves to electrically insulate the positive electrode and the negative electrode and prevent the occurrence of an internal short circuit.

However, during a process of manufacturing the electrode assembly or manufacturing the secondary battery including the electrode assembly, the separator is torn, damaged, and folded, which causes local contact between the electrodes. In this case, the contact between the electrodes causes problems of a low-voltage defect, a fire, explosion, and the like.

However, there is a problem in the related art in that it is difficult to precisely identify a local detection portion between the electrodes at the time of detecting a defect in the electrode assembly.

DETAILED DESCRIPTION OF THE INVENTION

Technical Problem

The present invention has been made in an effort to solve the problems in the related art, and an object of the present invention is to provide an apparatus and method for detecting a defect in a secondary battery, which reduce a defect rate of a secondary battery in accordance with variables such as a thickness and a position of an electrode tab.

Technical Solution

An embodiment of the present invention provides an apparatus for detecting a defect in a secondary battery, which includes a jelly-roll having first and second electrode tabs, and an electrode non-coated portion wound around an outermost periphery thereof, the apparatus including: a first contact unit configured to come into contact with any one of the first electrode tab and the second electrode tab; a second contact unit configured to come into contact with at least a part of the electrode non-coated portion and come into contact with the jelly-roll by moving in a direction of a center of the jelly-roll; and an inspection unit configured to detect whether the jelly-roll is defective by measuring one or more of current, voltage, and resistance of the jelly-roll by coming into electric contact with the first and second electrode tabs.

In the embodiment of the present invention, the apparatus may further include: a first position adjustment unit configured to adjust a position of the first contact unit so that the first contact unit is brought into contact with or separated from any one of the first and second electrode tabs; and a second position adjustment unit configured to adjust a position of the second contact unit so that the second contact unit is brought into contact with or separated from the electrode non-coated portion.

In the embodiment of the present invention, the first contact unit may be provided in the form of pincers configured to grip the first electrode tab or the second electrode tab.

In the embodiment of the present invention, the second contact unit may include: a main body; and a second contact part provided on one surface of the main body and configured to come into contact with the electrode non-coated portion.

In the embodiment of the present invention, the second contact part may include a plate shape.

In the embodiment of the present invention, the second contact part may have a flat surface, a concave surface, or a combination thereof.

In the embodiment of the present invention, the second contact unit may press the jelly-roll to come into contact with the jelly-roll.

In the embodiment of the present invention, the second contact unit may come into contact with or press the jelly-roll with pressure of 0.1 MPa or less.

In the embodiment of the present invention, the second contact unit may come into contact with the jelly-roll so that a diameter of the jelly-roll decreases by more than 0% and 10% or less based on the diameter of the jelly-roll.

In the embodiment of the present invention, a contact surface of the second contact part, which comes into contact with the electrode non-coated portion, may include a material having electrical conductivity.

In the embodiment of the present invention, the contact surface may include iron, nickel, stainless steel, or a mixture thereof.

In the embodiment of the present invention, the second contact part may be separably mounted on the main body.

In the embodiment of the present invention, the apparatus may further include: a power supply unit configured to apply test voltage to the first contact unit and the second contact unit.

In the embodiment of the present invention, the apparatus may further include: a control unit configured to store reference values of one or more of current, voltage, and resistance of the jelly-roll and determine a defect of the jelly-roll by comparing the reference value and data measured by the inspection unit.

In the embodiment of the present invention, the apparatus may further include: a mounting part configured to mount the jelly-roll.

In the embodiment of the present invention, the mounting part may include: a third contact part configured to come into contact with the jelly-roll; and a mounting part main body configured to support the third contact part.

Another embodiment of the present invention provides a method of detecting a defect in a secondary battery including a jelly-roll having first and second electrode tabs, and an electrode non-coated portion wound around an outermost periphery thereof, the method including: a first contact step of bringing a first contact unit into contact with the first electrode tab or the second electrode tab; a second contact step of bringing at least a part of a second contact unit into contact with the electrode non-coated portion; and an inspection step of detecting a defect in the jelly-roll by measuring one or more of current, voltage, and resistance of the jelly-roll by being brought into electric contact with the first electrode tab and the second electrode tab.

In the embodiment of the present invention, the method may further include: a step of applying test voltage to the jelly-roll.

In the embodiment of the present invention, in the inspection step, a defect in the jelly-roll may be determined by comparing a measured value and a reference value.

Advantageous Effects

According to the apparatus and method for detecting a defect in a secondary battery according to the embodiments of the present invention, it is possible to reduce a defect rate of the secondary battery in accordance with the variables such as the thickness and the position of the electrode tab.

BRIEF DESCRIPTION OF DRAWINGS

FIG. 1 is a front view illustrating an apparatus for detecting a defect in a secondary battery according to an embodiment of the present invention.

FIG. 2 is a cross-sectional view illustrating a second contact unit according to the present invention.

FIG. 3 is a cross-sectional view illustrating a mounting part according to the present invention.

EXPLANATION OF REFERENCE NUMERALS AND SYMBOLS

100: Apparatus for detecting defect
10: First contact unit
10*a*: Support part
10*b*: First contact part
11: First position adjustment unit
11*a*: Second movement part
11*b*: First movement part
11*c*: Cylinder
20: Second contact unit
21: Main body
22: Second contact part
23: Second position adjustment unit
30: Mounting part
31: Mounting part main body
32: Third contact part

BEST MODE

The detailed description of the present invention is provided to completely explain the present invention to a person with ordinary skill in the art. Throughout the specification, unless explicitly described to the contrary, when one component "comprises (includes)" another component or "characterized by" having a certain structure and a certain shape, this means that other components, structures, and shapes may be included without being excluded.

The present invention may be variously modified and may have various embodiments, and specific embodiments will be described in detail in the detailed description. However, the description of the embodiments is not intended to limit the contents of the present invention, but it should be understood that the present invention is to cover all modifications, equivalents and alternatives falling within the spirit and technical scope of the present invention.

Hereinafter, the present invention will be described in detail with reference to the drawings. However, the drawings are intended to illustratively describe the present invention, and the scope of the present invention is not limited by the drawings.

FIG. 1 is a front view illustrating an apparatus 100 for detecting a defect in a secondary battery according to an embodiment of the present invention.

The apparatus 100 for detecting a defect in a secondary battery serves to detect a defect in a jelly-roll included in a secondary battery and includes a first contact unit 10, a second contact unit 20, and an inspection unit (not illustrated).

The jelly-roll, which is applied to the apparatus 100 for detecting a defect of the present invention, may include a first electrode tab and a second electrode tab and be provided in the form having an electrode non-coated portion wound around an outermost periphery thereof. In more detail, the jelly-roll may include: a precursor made by previously and sequentially winding a first electrode, a first separator, a second electrode, and a second separator, and the electrode non-coated portion wound around an outermost periphery of the precursor once. Therefore, when a radius of the precursor is r, a length of a periphery of the precursor may be $2\pi r$, and a length of the electrode non-coated portion may be $2\pi r$ or more.

At least a part of the first contact unit 10 may come into contact with any one of the first and second electrode tabs. In this case, the contact means electric connection with the first or second electrode tab.

The first contact unit 10 may include a support part 10*a* and a first contact part 10*b*. The first contact part 10*b* may come into contact with the first or second electrode tab and be provided in the form capable of gripping the first or second electrode tab. For example, the first contact part 10*b* may be provided in the form of pincers or fingers. The support part 10*a* may receive power from the outside and operate the first contact part 10*b*. In other words, the support part 10*a* may receive power from the outside or from a first position adjustment unit 11 to be described below and move the first contact part 10*b* so that the first contact part 10*b* grips the first or second electrode tab.

The first contact unit 10 and the second contact unit 20 may grasp different electrode tabs. Particularly, because the negative electrode non-coated portion is wound around the outermost periphery of the jelly-roll according to the present invention, the first contact unit 10 may come into contact with the positive electrode tab while gripping the positive electrode tab, and the second contact unit 20 may come into contact with the negative electrode non-coated portion.

For example, in case that the first electrode tab is a positive electrode tab and the second electrode tab is a negative electrode tab, the first contact unit 10 may grip the first electrode tab. In case that the first electrode tab is a negative electrode tab and the second electrode tab is a positive electrode tab, the first contact unit 10 may grip the second electrode tab.

Because the second contact unit 20 comes into contact with the negative electrode non-coated portion, it is possible to detect a defect in the electrode assembly without damaging the electrode assembly.

The apparatus 100 for detecting a defect in a secondary battery according to the present invention may further include the first position adjustment unit 11. The first position adjustment unit 11 may adjust a position of the first contact unit 10 so that the first contact unit 10 may come into contact with any one of the first and second electrode tabs.

The first position adjustment unit 11 may move the first contact unit 10 in one or more directions. For example, the first position adjustment unit 11 may move the first contact unit 10 in first and second directions. In this case, the first direction may be a direction parallel to a direction in which the first or second electrode tab protrudes. Further, the second direction may be a direction perpendicular to the first direction.

The first position adjustment unit 11 may include: a first movement part 11*b* configured to move the first contact unit 10 in the first direction; and a second movement part 11*a* configured to move the first contact unit 10 in the second direction. The second movement part 11*a* may receive power from the outside and move the first contact unit 10 in the second direction.

For example, the first movement part 11*b* may include a rail, and a driving part (not illustrated) may be provided on one surface of the second movement part 11*a*, coupled to the rail, and configured to move along the rail.

Alternatively, the first movement part 11*b* may be coupled to a cylinder 11*c* and move the first contact unit 10 in the first direction by means of a movement of the cylinder. In this case, the second movement part 11*a* may be fixedly coupled to one surface of the first movement part 11*b* by screw-coupling or the like.

The second contact unit 20 may come into contact with at least a part of the electrode non-coated portion. The electrode non-coated portion is wound around the outermost periphery of the jelly-roll according to the present invention, such that the electrode non-coated portion may be electrically connected to an inner wall of a casing by coming into direct contact with the inner wall of the casing.

Therefore, the second contact unit 20 according to the present invention may apply power to the jelly-roll even though the second contact unit 20 comes into contact with a part of the electrode non-coated portion without coming into contact with the first or second electrode tab. Further, the apparatus 100 for detecting a defect in a secondary battery according to the present invention does not grip the negative electrode tab, which makes it possible to prevent the occurrence of a variable due to a defect caused by contact with the negative electrode tab at the time of detecting a defect in the secondary battery. Further, the defect detection may not be affected by a thickness and a position of the electrode tab.

FIG. 2 is a cross-sectional view illustrating the second contact unit 20 according to the present invention. The second contact unit 20 may include a main body 21 and a second contact part 22. The second contact part 22 may include a contact surface that comes into contact with the electrode non-coated portion. The second contact part 22 may have a predetermined height in a direction of the main body 21 from the contact surface.

The second contact part 22 may be separably coupled to the main body 21. That is, the second contact part 22 may be coupled to or separated from one surface of the main body 21. Therefore, only the second contact part 22 may be separated and replaced in case that the contact surface of the second contact unit 20 is contaminated or damaged, and the second contact unit 20 cannot transmit current to the jelly-roll.

The coupling method is not particularly limited as long as the second contact part 22 may be separable from the main body 21 of the second contact unit 20. However, the main body 21 and the second contact part 22 may be separably coupled by screw-coupling or fitting.

The second contact part 22 may include a plate shape. For example, the second contact part 22 may have a flat surface, a curved surface, or a combination thereof.

In this case, the curved surface may have a concave curved shape corresponding to an external shape of the jelly-roll. For example, in case that the jelly-roll has the cylindrical shape, a cross-section of the jelly-roll, which comes into contact with the second contact unit 20, may have a convex shape, and a cross-section of the contact surface of the second contact unit 20 may have a concave shape that may be fitted with the convex cross-section of the jelly-roll.

A curvature of the second contact unit 20 may be equal to a surface curvature of the jelly-roll that comes into contact with the second contact unit 20. Alternatively, the second contact unit 20 may have a larger curvature than a surface of the jelly-roll.

Alternatively, a radius of curvature of the second contact unit 20 may be equal to a radius of curvature of the jelly-roll or larger than the radius of curvature of the jelly-roll.

In the embodiment, model 2170 may be used as the jelly-roll, and model 2170 is the jelly-roll having a diameter of 20 mm to 21 mm. In this case, the radius of curvature of the second contact unit 20 may be 0.02 mm to 0.1 mm larger than the radius of curvature of the jelly-roll.

The second contact unit 20 may transmit the voltage, which is applied from the external power source, to the jelly-roll through the contact surface with the jelly-roll. Therefore, the contact surface of the second contact unit 20 may include an electrically conductive material. For example, the electrically conductive material may include a metallic material, and the metallic material may include iron, nickel, stainless steel, or the like.

Further, the main body 21 may include an non-electrically conductive material or a semiconductor material.

The apparatus 100 for detecting a defect in a secondary battery according to the present invention may further include a second position adjustment unit 23. The second position adjustment unit 23 may adjust a position of the second contact unit 20 so that the second contact unit 20 and the electrode non-coated portion may come into contact with or be separated from each other.

The second position adjustment unit 23 may move the second contact unit 20 in one or more directions. Particularly, the second position adjustment unit 23 may move only in one direction. For example, the second contact unit 20 may come into contact with a lateral surface of the jelly-roll that does not have the first and second electrode tabs and move in a direction of a center of the jelly-roll and a direction opposite to the direction of the center of the jelly-roll.

The second position adjustment unit 23 may include a second cylinder coupled to the main body 21 of the second contact unit 20 and configured to move the second contact unit 20 in a direction perpendicular to a central axis of the jelly-roll. In the second position adjustment unit 23, a piston rod of the second cylinder is positioned in the direction perpendicular to the central axis of the jelly-roll, and the second contact unit 20 is coupled to one surface of a screw provided in the piston rod and configured to move along the piston rod. Therefore, the second position adjustment unit 23 may move the second contact unit 20 upward or downward by means of the screw.

The second contact unit 20 may come into contact with the jelly-roll by moving downward in the direction of the jelly-roll direction. In this case, the second position adjustment unit 23 may include a pressure adjustment part (not illustrated) capable of adjusting pressure to be applied to the jelly-roll when the second contact unit 20 comes into contact with the jelly-roll.

Therefore, the second contact unit 20 may be electrically connected to the jelly-roll without coming into contact with the jelly-roll or press the jelly-roll with a force to the extent that the jelly-roll is not damaged by the pressure adjustment part.

For example, the pressure adjustment part may adjust the pressure, which is applied to the jelly-roll by the second contact unit 20, to 0.1 MPa or less. Alternatively, the pressure adjustment part may press the jelly-roll so that a diameter of the jelly-roll decreases by more than 0% and 10% or less based on the diameter of the jelly-roll.

The pressure adjustment part may control the pressing force of the second contact unit within the above-mentioned range, which may minimize damage to and destruction of the jelly-roll.

The apparatus 100 for detecting a defect in a secondary battery according to the present invention may further include a mounting part 30 configured to mount the jelly-roll. The mounting part 30 may be provided at a position facing the second contact unit 20. One or more mounting parts 30 may be provided.

A contact surface of the mounting part 30, which comes into contact with the jelly-roll, may be provided in the form of any one of a flat surface and a curved surface. In case that the contact surface of the mounting part 30 is a curved surface, the curved surface may be formed to be fitted with the jelly-roll mounted on the contact surface of the mounting part 30.

Further, the mounting part 30 may move in a direction of the second contact unit 20 and a direction opposite to the direction of the second contact unit 20. Therefore, the apparatus 100 for detecting a defect in a secondary battery may bring the second contact unit 20 into contact with the jelly-roll by moving the mounting part 30 upward or downward.

The contact surface of the mounting part 30 may include any one of a conductive material and a semiconductor material. For example, the conductive material may include a metallic material, and the metallic material may include iron, nickel, stainless steel, or the like.

FIG. 3 is a cross-sectional view illustrating the mounting part 30 according to the present invention. The mounting part 30 may include a third contact part 32 including a contact surface. That is, the mounting part 30 may include a mounting part main body 31, and the third contact part 32 coupled to one surface of the mounting part main body 31. The third contact part 32 may be separated from or coupled to the mounting part main body 31.

The mounting part 30 may be provided as a pair of mounting parts 30. Alternatively, a single mounting part may extend in a longitudinal direction of the jelly-roll. In this case, the longitudinal direction of the jelly-roll means a length of a straight line that connects two opposite ends of the jelly-roll at which the first and second electrode tabs protrude.

The inspection unit may detect a defect in the jelly-roll while electrically coming into contact with the first and second electrode tabs. That is, the inspection unit may detect a defect in the jelly-roll by measuring one or more of current, voltage, and resistance of the jelly-roll.

The apparatus 100 for detecting a defect in a secondary battery according to the present invention further includes a power supply unit (not illustrated) configured to apply test power to the first contact unit 10 and the second contact unit 20. The power supply unit supplies electricity, which is required to charge and discharge the jelly-roll, to the first contact unit 10 and the second contact unit 20.

In this case, the inspection unit may measure one or more of current, voltage, and resistance of the jelly-roll that receives electricity.

For example, the apparatus 100 for detecting a defect in a secondary battery may measure through current, voltage, and resistance in the event of a short circuit by over-charging the jelly-roll from an external power source. When the separator is short-circuited in the jelly-roll, the positive electrode and the negative electrode are not insulated, and over-current occurs in the jelly-roll at the time of over-charging. For this reason, a capacity of the jelly-roll may decrease as a current value of the jelly-roll increases. Further, in the case of the jelly-roll including an internal short circuit, the through current and voltage may decrease at the time of over-charging as the capacity of the jelly-roll decreases.

Therefore, in case that the secondary battery has a defect, the inspection unit may measure current and voltage each having a value lower than a reference value pre-stored in a control unit (not illustrated) to be described below.

The positive and negative electrodes of the jelly-roll need to be insulated by the separator. When the separator is short-circuited, ignition and explosion may occur because the positive and negative electrodes come into contact with each other, and over-current flows.

The inspection unit may further measure a temperature to detect ignition and explosion in the jelly-roll. For example, the inspection unit may include a data logger having a thermocouple.

The apparatus 100 for detecting a defect in a secondary battery according to the present invention may further include the control unit configured to store the reference value or receive the reference value from the outside, the reference value being used to be compared with current, voltage, and resistance of the jelly-roll measured by the inspection unit. The control unit determines a defect by comparing the reference value with the measured value measured by the inspection unit.

The reference value may include values of one or more of current, voltage, and resistance measured when power is supplied to the jelly-roll that is a good product having no defect such as a short circuit. In this case, power applied to the jelly-roll, which is a good product, may be identical to power applied to the jelly-roll at the time of measuring a defect in the secondary battery.

A method of detecting a defect in a secondary battery according to the present invention includes a first contact step S10, a second contact step S20, and an inspection step S30.

The first contact step S10 is a step of bringing the first or second electrode tab into contact with the first contact unit by moving the first contact unit.

For example, the first contact step S10 may include: a step of increasing a distance between the pair of pincers or fingers of the first contact unit by operating the pair of pincers or fingers by receiving power from the outside; a step of adjusting the position of the first contact unit by sensing the position of the first or second electrode tab; and a step of gripping, by the pincers or fingers, the first or second electrode tab by decreasing the distance between the pair of pincers or fingers.

The second contact step S20 is a step of bringing at least a part of the second contact unit into contact with the electrode non-coated portion.

For example, the second contact step S20 may include: a step of moving the second contact unit; and a step of stopping the movement of the second contact unit when the second contact unit comes into contact with the electrode non-coated portion.

The inspection step S30 is a step of detecting a defect in the jelly-roll by measuring one or more of current, voltage, and resistance of the jelly-roll by bringing the inspection unit into electric contact with the first and second electrode tabs.

The method of detecting a defect in a secondary battery according to the present invention may further include a step of applying test voltage to the jelly-roll.

In the inspection step S30, any one of current, voltage, and resistance of the jelly-roll may be measured when the jelly-roll is operated by the test voltage.

For example, the inspection step S30 may include: a step of bringing the inspection unit into contact with the first and second electrode tabs; a step of measuring one or more of current, voltage, and resistance of the jelly-roll to which the test voltage is applied; and a step of determining a defect in the jelly-roll by comparing the measured value and the reference value.

In this case, the reference value may be pre-stored, or data related to the reference value may be transmitted from the outside.

The secondary battery is determined as being defective when the measured current and voltage are equal to or less than the reference values or the measured resistance is equal to or more than the reference value. The secondary battery may be determined as a good product when the measured current, voltage, and resistance are equal to the reference values.

Regarding the same components applied to the apparatus and method for detecting a defect in a secondary battery, the description of the method may be substituted with the description of the apparatus.

While the present invention has been described above with reference to the exemplary embodiments, it may be understood by those skilled in the art that the present invention may be variously modified and changed without departing from the spirit and scope of the present invention disclosed in the claims.

The invention claimed is:

1. An apparatus for detecting a defect in a secondary battery, the secondary battery comprising a jelly-roll having first and second electrode tabs, and an electrode non-coated portion wound around an outermost periphery thereof, the apparatus comprising:

a first contact unit configured to electrically contact any one of the first electrode tab and the second electrode tab;

a second contact unit configured to electrically contact at least a part of the electrode non-coated portion and come into contact with the jelly-roll by moving in a direction of a center of the jelly-roll; and an inspection unit configured to detect whether the jelly-roll is defective by measuring one or more of current, voltage, and resistance of the jelly-roll by an electrical connection between the electrode non-coated portion and the any one of the first electrode tab and the second electrode tab.

2. The apparatus of claim 1, further comprising:

a first position adjustment unit configured to adjust a position of the first contact unit so that the first contact unit contacts or is separated from any one of the first and second electrode tabs; and a second position adjustment unit configured to adjust a position of the second contact unit so that the second contact unit contacts with or is separated from the electrode non-coated portion.

3. The apparatus of claim 1, wherein the first contact unit includes pincers configured to grip the first electrode tab or the second electrode tab.

4. The apparatus of claim 1, wherein the second contact unit comprises:

a main body; and a second contact part on one surface of the main body and configured to contact the electrode non-coated portion.

5. The apparatus of claim 4, wherein the second contact part includes a plate shape.

6. The apparatus of claim 4, wherein the second contact part has a flat surface, a concave surface, or a combination thereof.

7. The apparatus of claim 4, wherein a contact surface of the second contact part, which contacts the electrode non-coated portion, includes an electrically conductive material.

8. The apparatus of claim 7, wherein the contact surface includes iron, nickel, stainless steel, or a mixture thereof.

9. The apparatus of claim 4, wherein the second contact part is separably mounted on the main body.

10. The apparatus of claim 1, wherein the second contact unit presses the jelly-roll to contact with the jelly-roll.

11. The apparatus of claim 1, wherein the second contact unit contacts or presses the jelly-roll with pressure of 0.1 MPa or less.

12. The apparatus of claim 1, wherein the second contact unit contacts the jelly-roll so that a diameter of the jelly-roll decreases by more than 0% and 10% or less based on the diameter of the jelly-roll as compared to a state of the jelly-roll not contacting the second contact unit.

13. The apparatus of claim 1, further comprising:

a power supply unit configured to apply a test voltage to the first contact unit and the second contact unit.

14. The apparatus of claim 1, further comprising:

a control unit configured to store reference values of one or more of a current, a voltage, and a resistance of the jelly-roll and to determine a defect of the jelly-roll by comparing the reference value with data measured by the inspection unit.

15. The apparatus of claim 1, further comprising:

a mounting part configured to mount the jelly-roll.

16. The apparatus of claim 15, wherein the mounting part comprises:

a third contact part configured to contact the jelly-roll; and a mounting part main body configured to support the third contact part.

17. A method of detecting a defect in a secondary battery that includes a jelly-roll having first and second electrode tabs, and an electrode non-coated portion wound around an outermost periphery thereof, the method comprising:

bringing a first contact unit into electrical contact with the first electrode tab or the second electrode tab;

bringing at least a part of a second contact unit into electrical contact with the electrode non-coated portion; and inspecting the jelly-roll to detect a defect in the jelly-roll by measuring one or more of a current, a voltage, and a resistance of the jelly-roll by an electrical connection between the electrode non-coated portion and the any one of the first electrode tab and the second electrode tab.

18. The method of claim 17, further comprising:

applying a test voltage to the jelly-roll.

19. The method of claim 17, wherein, in the inspecting, a defect in the jelly-roll is detected by comparing a measured value and a reference value.

20. The method of claim 17, further comprising:

adjusting a position of the first contact unit so that the first contact unit contacts or is separated from any one of the first and second electrode tabs; and adjusting a position of the second contact unit so that the second contact unit contacts with or is separated from the electrode non-coated portion.

21. The method of claim 17, wherein, in the bringing at least a part of the second contact unit into electrical contact with the electrode non-coated portion, the second contact unit contacts the jelly-roll so that a diameter of the jelly-roll decreases by more than 0% and 10% or less based on the diameter of the jelly-roll as compared to a state of the jelly-roll not contacting the second contact unit.

* * * * *